United States Patent

[11] 3,536,004

[72] Inventor Charles H. Derrickson
Chicago, Illinois

[21] Appl. No. 674,423
[22] Filed Oct. 11, 1967
[45] Patented Oct. 27, 1970
[73] Assignee American Screen Process Equipment Co.
a corporation of Illinois

[54] CIRCUIT BOARD FEEDING AND REGISTERING MEANS IN STENCIL PRINTING MACHINES
11 Claims, 4 Drawing Figs.

[52] U.S. Cl. 101/123, 101/407; 271/58; 29/625
[51] Int. Cl. B41f 15/18, B41f 1/34; B65h 9/06
[50] Field of Search 101/407, 123, 124, 114, 126, 369; 271/69, 58, 59, 60, 74; 29/625(ES)

[56] References Cited

UNITED STATES PATENTS

| | | | |
|---|---|---|---|
| 1,589,546 | 6/1926 | Nichols | 101/123 |
| 1,832,828 | 11/1931 | Borregard | 101/123 |
| 1,840,073 | 1/1932 | Williams | 101/123 |
| 1,922,341 | 8/1933 | Aldcroftt | 101/123 |
| 2,050,745 | 8/1936 | Woodruff et al. | 101/407X |
| 2,132,412 | 10/1938 | Gollwitzer | 101/369 |
| 2,211,310 | 8/1940 | Andrews | 101/19 |
| 2,349,163 | 5/1944 | Gibbs | 101/369X |
| 2,610,579 | 9/1952 | Wing | 101/123 |
| 3,168,039 | 2/1965 | Buttner | 271/58 |
| 3,228,682 | 1/1966 | Buccicone | 271/74 |

*Primary Examiner*—William B. Penn
*Attorney*—Neal J. Mosely

ABSTRACT: In the processing of printed circuit boards, such as assembly of components thereon, imprinting of circuit designs, etc., accurate registration of the board is required. Board blanks, rough cut to size, are provided with a plurality of registration apertures and with at least two "V" notches along one edge, accurately located in relation to said registration apertures. The boards are stacked in a feeding frame or hopper and fed rapidly by a conveyor along a vacuum table to a processing station, such as a screen process printing station for application of the desired circuit design. The station is provided with a pair of pointed abutment members spaced to engage said "V" notches on each board. A movable member pushes each board into position with said abutment members engaging said "V" notches which locates the board accurately for printing or other processing at said station. On completion of the processing step the board is moved past said registration abutment members and another board moved into position for processing.

CHARLES H. DERRICKSON
*INVENTOR.* his attorney

CHARLES H. DERRICKSON
*INVENTOR.*

Neal J. Mosely
his attorney

CIRCUIT BOARD FEEDING AND REGISTERING MEANS IN STENCIL PRINTING MACHINES

BACKGROUND OF THE INVENTION

In the preparation of printed circuit boards for mass production of electronic circuit equipment such as radio, television, and radar equipment, one of the most common manufacturing processes utilizes circuit board blanks of laminated plastic, such as paper or cloth base phenolic laminates of electric insulating board quality, with a thin copper cladding (or other metallic layer) on at least one surface of the board. The metallic surface of the board is imprinted with a resist coating in the desired circuit pattern. The imprinted board is then passed through an acid etch or other chemical bath which dissolves away all of the metallic coating except the areas covered by the circuit design resist. The board is thus left with a partial coating of metal only in the circuit design areas. Next, the board is treated to remove the resist from at least the portions of the circuit design where circuit components are to be assembled and soldered or otherwise connected in the circuit.

The printed circuit board with the circuit fully formed is placed in a suitable jig or frame and holes drilled in the board at the points where various components are to be assembled. The board is then moved to an assembly station where the various circuit components, vacuum tube sockets, transistors, resistors, capacitors, inductors, etc., are assembled to produce the completed electronic device.

In the processing of printed circuit boards at all points from the initial laydown of the printed circuit design resist through the drilling of the board and the assembly of the various circuit components thereon, extremely accurate registration of the circuit board is required. If the circuit board is only slightly out of registration of any of these steps, an imcomplete circuit may result due to the mislocation of the circuit on the board or the mislocation of circuit components in relation to the circuit design.

In the handling of printed circuit boards, one method of registration of the boards has been to provide a plurality of registration holes or apertures at predetermined regions of the board. These registration holes or apertures permit the board to be located by registration dowels or pins at various processing stations. The use of registration holes or apertures to fit the boards over registration pins or dowels has proved quite satisfactory in processing stations where the boards are drilled or componenets assembled. These registration devices, however have proved quite ineffective in the registration of printed circuit boards during high speed printing of circuit design resists on the boards and are also somewhat inefficient even in the drilling and assembly steps where high speed processing of circuit boards is desired. Another disadvantage in the use of registration holes or apertures in printed circuit boards arises from the frequent variation in size of the boards as applied by the manufacturer. The printed circuit board blanks are generally prepared as large size panels by the manufacturer and are cut to size to the specifications of the circuit board manufacturer. The board as supplied to the circuit board manufacturer often will vary as much as one/sixteenth inch in width with the result that the location of the registration apertures in a fixed position in relation to either edge will result in the circuit boards being misaligned in one or more of the processing steps by the amount of variation in the width of the board.

STATEMENTS OF OBJECTS AND FEATURES OF THE INVENTION

It is, therefore, one object of this invention to provide a new and improved method for the registration of printed circuit boards blanks during high-speed processing.

Another object of this invention is to provide a new and improved method and apparatus through registration of printed circuit boards (or blanks) during printing or drilling or component assembly steps or other steps in the processing of the circuit boards which provides for accurate registration of the board during processing.

One of the features of this invention is the provision of a new and improved method and apparatus for handling printed circuit boards (or blanks) during various processing steps wherein the circuit boards are provided with "V " notches along one edge thereof which are accurately located in relation to registration holes or apertures in the boards and which notches engage pointed abutment members to hold the circuit board in precise predetermined registration at each processing station.

Another feature of this invention is the provision of an improved processing apparatus for printed circuit boards (or blanks) including conveyor means for moving the boards at high-speed to a processing station, such as a screen process printing station for application of a circuit design resist to the board, and which apparatus is provided with at least two pointed abutment members engageable with the notches accurately located along one edge of the circuit board and including means to engage the circuit board at the processing station to hold the same with the "V " notches in engagement with the pointed abutment members during the processing step.

Other objects and features of this invention will become apparent from time to time throughout the specification and claims as hereinafter related.

BRIEF DESCRIPTION OF THE DRAWINGS

In the accompanying drawings, to be taken as a part of this specification, there is clearly and fully illustrated a preferred embodiment of the invention, in which drawings.

SUMMARY OF THE INVENTION

This invention comprises a new and improved apparatus for the processing of printed circuit boards (or blanks) and provides for the extremely accurate registration of printed circuit boards at each processing station. In its preferred form, this invention comprises a new and improved method and apparatus for accurate registration of printed circuit board blanks at the screen process printing station for application of a circuit design resist by screen process printing. The printed circuit board blanks, in the form of metal clad insulating boards, are rough cut to the desired dimensions and are provided with a plurality of registration holes or apertures, preferably adjacent to the corners of the boards, for registration and assembly of the boards in the final stages of processing. Alone one edge of the boards, there are provided at least two "V " notches which are accurately located in relation to the registration hole or apertures.

The apparatus for processing the printed circuit board blanks is provided with a feed hopper or frame and a conveyor for moving the boards rapidly from the hopper or frame along a vacuum table to the screen process printing (or other processing) station and for ejecting the process boards from the apparatus.

At the processing station, the apparatus is provided with a pair of pointed registration abutments spaced accurately to align with and engage the notches in the edge of each circuit board blank. At the processing station, there is also provided a laterally movable pusher member for moving each circuit board into engagement with the pointed abutment members, with said members positioned in the "V" notches and accurately positioning the board for screen process printing or other processing. After the processing step is completed, the pusher member is retracted and the processed circuit board is moved past the abutment members by the conveyor and ejected from the apparatus.

DESCRIPTION OF THE PREFERRED EMBODIMENT

Figure 1:
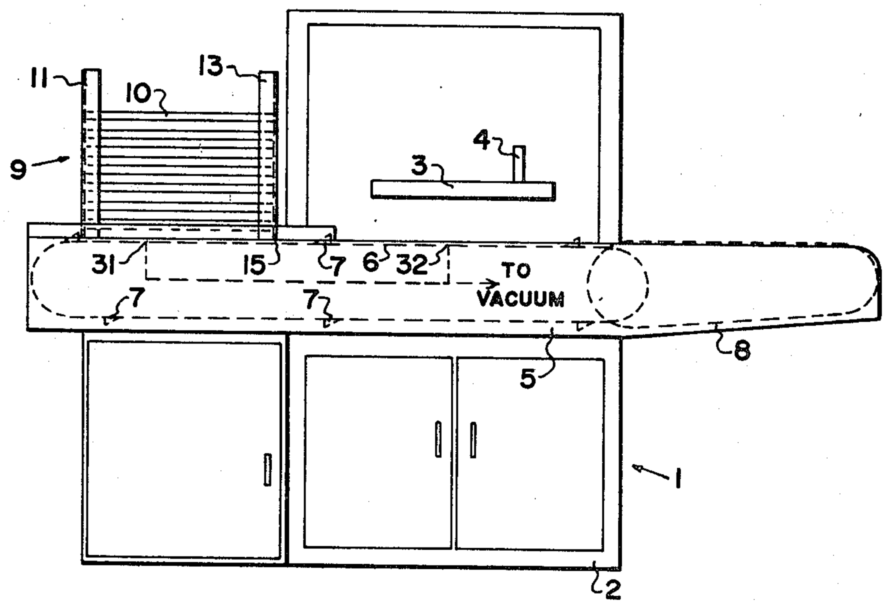
FIG. 1 is a view in elevation, and at least partially schematic, of a printed circuit board processing apparatus including a conveyor and screen process stencil station embodying a preferred form of this invention.

Referring to the drawings by numerals of reference, and more particularly to FIG. 1, there is shown an apparatus 1 for the processing of printed circuit boards, and more particularly for the screen process printing of circuit design resists on printed circuit boards, which include the novel circuit board registration means which is a major novel feature of this invention. The processing apparatus 1 is preferably an American-DuBuit, high-speed, screen process printer.

Apparatus 1 includes a supporting framework or cabinet 2 having a screen process printing station illustrated diagrammatically by screen process stencil 3 and squeege 4. The framework 2 is provided with horizontally extending table 5 which supports a feed conveyor chain 6 having a plurality of dogs or lugs 7 for feeding printed circuit boards to the screen process printing station. At the right end of table 5, there is provided a second conveyor 8 which overlaps conveyor 6 and provides for ejection of printed circuit boards from the apparatus after passing the screen process printing station. At the left end of table 5, there is provided a feed frame or hopper 9 in which there are supported a plurality of circuit board blanks 10. The circuit board blanks are shown in more detail in plan view in FIGS. 2, 3, and 4.

Figure 2:
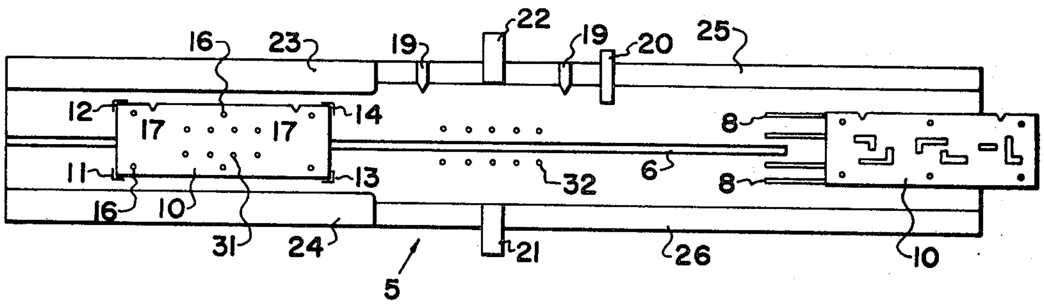
FIG. 2 is a plan view, of the conveyor and registration portions of the apparatus in FIG. 1.

Feed hopper or frame 9 is constructed of four angle iron members 11, 12, 13, and 14, seen in plan view in FIG. 2. Angle iron members 13 and 14 are provided with a cutout portion 15 adjacent to conveyor 6 to provide an opening just large enough for one of the circuit board blanks 10 to be moved by one of the lug members 7 on conveyor 6. This arrangement permits rapid and automatic feeding of circuit board blank 10 by conveyor 6 to screen process (or other processing) station. The printed circuit board blanks 10 are provided with a plurality of holes or apertures 16 which are positioned to receive registration pins or dowels in subsequent processing of the boards, as in the assembly of circuit components thereon. The boards are provided with at least two "V" notches 17 and may, if desired, be provided with an end notch 18 for engagement with a stop member at the sceen process printing station.

At the screen process printing station (or other circuit processing station), there are provided a pair of pointed abutment members 19 which are accurately spaced to fit "V" notches 17 on circuit board blanks 10 when in position at the printing station. There is also provided an end stop member 20 at the printing station and movable members 21 and 22 for moving circuit board members 10 into and out of engagement with abutment members 19. The arrangement of the abutment members 19 and 20 and movable members 21 and 22 is seen in slightly more detail in FIGS. 3 and 4.

Horizontal table 5 is a vacuum table having holes 31 at the feed end and hole 32 at the printing station connected to a source of vacuum (not shown). Table 5 is provided with guide rails 23 and 24 at the feed end and guide rails 25 and 26 extending through the printing station to the ejection end of the table. In the screen process printing station, the guide rails 23 and 24 are provided with cover plates 27 and 28 which are shown partially broken away to illustrate the arrangement of abutment 19 and 20 and movable members 21 and 22. Abutment members 19 are fixed in position and engage "V" notches 17 in the side of circuit board blank 10 when the circuit board blank is located at the screen process printing station. The "V" notches 17 in circuit board 10 are cut accurately in relation to registration holes or apertures 16 and are also cut in very accurate location in relation to the spacing of pointed abutment members 19.

The distance between notch 18 at the end of circuit board member 10 and the closest "V" notch 17 is a few thousandths of an inch less than the spacing between abutment member 20 and the closest one of the pointed abutment members 19. The members 20, 21, and 22 are arranged for reciprocal movement by actuating means, indicated diagrammatically as 21*a*, so that member 21 engages circuit board 10 and moves the same against pointed abutment members 19 for accurate registration of the circuit board at the screen process printing station. After completion of the screen process printing of the circuit design resist imprint 29 by stencil 3 and squeegee 4, member 22 moves to engage the edge of circuit board blank 10 to move the same away from abutment members 19 to permit removal of the printed circuit board 10 from the apparatus by further movement of conveyor 6 and discharge conveyor 8.

OPERATION

Figure 3:
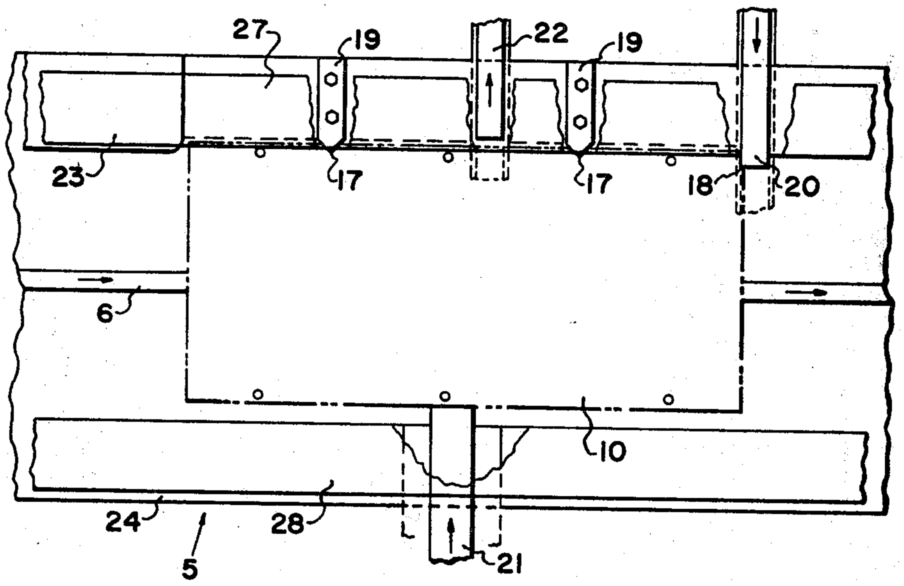
FIG. 3 is a detail view, slightly enlarged in relation to FIG. 2, of the circuit board registration means at the screen process printing station with a circuit board positioned in registration for printing.
Figure 4:
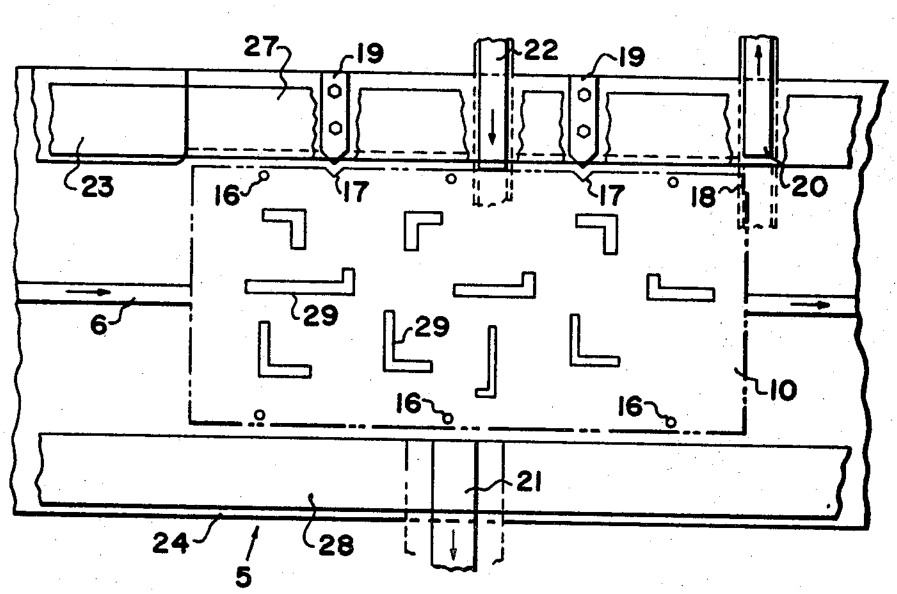
FIG. 4 is a detail view of the registration means at the screen process printing station with the circuit board printed and moved into position for ejection from the screen process printing station.

The operation of the apparatus as a whole should be apparent from the description of the individual parts but will be redescribed for clarification. The apparatus is arranged to be operated intermittently by electric motors or other suitable driving mechanism and suitable timing mechanism, not shown. The registration device, as illustrated in FIGS. 2, 3, and 4 of the drawings, is applied to a screen process printing station. This registration mechanism, however, may be used for registering the printing circuit board at any processing station on a conveyor mechanism. Thus, the registration station may be used for registration of printed circuit boards for screen process printing or for drilling the boards or for location of the circuit components on the finished boards.

With the printed circuit boards 10 placed in feeding frame 9, the conveyors 6 and 8 are intermittently operated by conventional indexing mechanism to move circuit boards to the screen process printing station and then to eject the printed boards from the apparatus. The vacuum applied through holes 31 at the feed station holds the boards 10 flattened against the table 5 to facilitate their movement by conveyor 6. Conveyor 6 is moved a predetermined distance with the result that board 10 is moved to the printing station. At the printing station, the vacuum applied through holes 32 holds the board 10 in a flattened condition to facilitate its location by the registration mechanism. At the printing station, circuit board blank 10 is positioned with notched portion 18 against stop member 20 which locates notches 17 adjacent to pointed abutment members 19. Member 21 is moved as shown in FIG.3 by actuating means 21*a* to engage the edge of circuit board 10 and move the same so that it is held tightly with notches 17 engaged by pointed abutment members 19. In this position, the circuit board is printed by action of squeegee 4 forcing printing ink through screen process stencil 3 to imprint the circuit board with the desired resist design 29, as shown in FIG. 4.

On completion of the printing cycle, screen process stencil 3 is moved away from the printed circuit board blank 10 and the circuit board blank is ready to be ejected and a new board blank moved into position for printing. At the end of the printing cycle, movable member 22 moves as shown in FIG. 4 to engage the notched edge of circuit board blank 10 and move the same away from pointed abutment members 19. In this position, further movement of conveyor 6 moves circuit board blank 10 to the point where it is picked up by ejection conveyor belts 8 and ejected from the apparatus. During the ejection of the printed board blank from the printing station, stop member 20 is moved back to the position shown in FIG. 3 where it engages the notched end portion 18 of the next circuit board blank moved into position.

The operation of members 20, 21, and 22 is timed with the actuation of conveyors 6 and 8 and with the operation of squeegee 4 and screen process stencil 3 so that an unprinted board blank is moved into the printing station, accurately registered by movement of member 21 to cause notches 17 to engage pointed abutment members 19, printed, and then ejected from the apparatus. As the printed circuit board blank 10 is ejected from the apparatus, the next unprinted board blank is moved into position and registered for printing (or other processing) as previously described.

While this apparatus has been described with special emphasis upon its use in registering printed circuit board blanks for a screen process printing step, it is apparent that the registration mechanism and method are applicable to the registration of a printed circuit board blank for any of the various processing steps in its manufacture. Thus, the apparatus as shown in FIGS. 2, 3, and 4 is primarily an apparatus for registration of a circuuit board blank moved by a conveyor into and out of a screen process printing station. The registration method and apparatus is of general application in the processing of printed circuit board blanks but is especially useful in registration of unprinted board blanks at the printing station where the circuit design resist is applied by screen process printing.

While this invention has been described with special emphasis upon a single preferred embodiment, it should be understood that within the scope of the appended claims the invention may be practiced otherwise than as specifically described herein.

I claim:

1. The combination with an apparatus for processing printed circuit board blanks including a printing station, a feed hopper for feeding a plurality of said blanks, and intermittently operated conveyor means for moving said blanks successively to said station, said blanks each having a plurality of apertures adapted for registration of said blanks during subsequent processing and assembly and having at least two "V" notches formed in one edge thereof in predetermined accurate relation to said apertures, of means at said printing station for registering each blank for printing, said registration means comprising:

a. a pair of pointed abutment members fixed in predetermined position to fit said "V" notches in said printed circuit board blanks;
b. means to move each blank laterally to engage the "V" notches therein with said abutment members and register said board for printing; and
c. means to move each board laterally away from said abutment members after printing for ejection of said board by said conveyor means.

2. An apparatus in accordance with claim 1 which includes means to apply a vacuum to the underside of the blanks at the feed hopper and at the printing station to hold the blanks in a flattened condition.

3. An apparatus in accordance with claim 1. in which said printing station is a screen process printer and said blank moving means are coordinated to register a blank during screen process printing of a circuit design thereon and move said blanks to a position for ejection after printing.

4. An apparatus in accordance with claim 1 in which said printing station includes movable stop means for stopping each blank in position for lateral movement to engage said "V" notches with said pointed abutment members.

5. An apparatus in accordance with claim 1 in which said laterally moving means comprises a pair of movable abutment members positioned on opposite sides of said conveyor means and movable laterally thereto, means to move one of said movable abutment members in one direction to engage a blank and move the same to engage said "V" notches thereon with said pointed abutment members to register the blank for printing, and means to move the other movable abutment member in the opposite direction to engage said blank to move the same away from said pointed abutment members.

6. An apparatus in accordance with claim 4 in which said laterally moving means comprises a pair of movable abutment members positioned on opposite sides of said conveyor means and movable laterally thereto, means to move one of said movable abutment members in one direction to engage a blank and move the same to engage said "V" notches with said pointed abutment members to register the blank for printing and to move the other movable abutment member in the opposite direction to engage said blank to move the same away from said pointed abutment members after printing.

7. An apparatus in accordance with claim 6 in which said stop member is movable in coordination with said movable abutment member and is moved to a stop position when said first named movable abutment member is in a retracted position and is moved out of said stop position when said first named movable abutment member is moved to engage said board with said pointed abutment members.

8. An apparatus in accordance with claim 7 in which said processing station is a screen process printer and said movable abutment members are coordinated in movement to register a blank during printing of a circuit design thereon and to move said board away from said pointed abutment members after printing.

9. In the processing of printed circuit board blanks wherein a plurality of blanks are fed by an intermittedly moved conveyor to a processing printing station, the improvement which comprises:

a. rough cutting metal clad printed circuit board blanks to approximate size;
b. forming a plurality of apertures in said blanks adapted for registration of said blanks during subsequent processing and assembly;
c. forming two "V" notches along one edge of each blank in a predetermined accurate location in relation to said registration aperature;
d. feeding a plurality of said blanks, having said registration apertures and "V" notches therein to said conveyor, for intermittent movement to said printing station,
e. moving each blank at the printing station laterally to engage said "V" notches with a pair of fixed pointed abutment members to register such blank in a fixed predetermined position in relation to said registration aperture during printing; and
f. each blank from registration engagement with said fixed pointed abutment members and ejecting the blank from the printing station after printing it.

10. A process in accordance with claim 9 in which a vacuum is applied to the blanks at the point of introduction to the conveyor and at the printing station to hold the boards in a flattened condition.

11. A process in accordance with claim 9 in which the blank is moved laterally away from said abutment members for ejection by said conveyor.